(12) United States Patent
Iwamoto et al.

(10) Patent No.: US 10,007,301 B2
(45) Date of Patent: Jun. 26, 2018

(54) ELECTRONIC DEVICE (71) Applicant: Panasonic Intellectual Property Management Co., Ltd., Osaka (JP)

(72) Inventors: Akira Iwamoto, Osaka (JP); Kenichi Shindo, Osaka (JP); Takeshi Mori, Osaka (JP); Noriyuki Maki, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days. days.

(21) Appl. No.: 15/189,212

(22) Filed: Jun. 22, 2016

(65) Prior Publication Data
US 2016/0306395 A1   Oct. 20, 2016

Related U.S. Application Data (63) Continuation of application No. PCT/JP2014/004236, filed on Aug. 19, 2014.

(30) Foreign Application Priority Data

Dec. 25, 2013 (JP) .................. 2013-267790

(51) Int. Cl.
*G06F 1/16* (2006.01)
*H05K 5/02* (2006.01)

(52) U.S. Cl.
CPC .......... *G06F 1/1656* (2013.01); *G06F 1/1626* (2013.01); *H05K 5/0221* (2013.01);
(Continued)

(58) Field of Classification Search
CPC ... G06F 1/1656; G06F 1/1626; H05K 5/0221; H05K 5/0226; H05K 5/0239; H05K 5/0247
See application file for complete search history.

(56) References Cited

U.S. PATENT DOCUMENTS 8,045,323 B2 * 10/2011 Murakata ............. H05K 5/0086
361/679.01
8,107,227 B2 * 1/2012 Long ................... H04M 1/0274
292/57
(Continued)

FOREIGN PATENT DOCUMENTS

JP      2-100242      8/1990
JP      2008-10478    1/2008
(Continued)

OTHER PUBLICATIONS

Internal Preliminary Report on Patentability and Written Opinion of the International Searching Authority dated Jul. 7, 2016 in corresponding International Application No. PCT/JP2014/004236.
(Continued)

*Primary Examiner* — Hoa C Nguyen
*Assistant Examiner* — Keith Depew
(74) *Attorney, Agent, or Firm* — Wenderoth, Lind & Ponack, L.L.P.

(57) ABSTRACT

An electronic device includes a terminal port disposed in a side surface of a housing and opened to an outside of the housing and a cover that openably and closably covers the terminal port. An outer circumferential part of the cover is provided with a sealing member that contacts an inner circumferential wall of the terminal port in such a state that the terminal port blocks a recess to seal an inside of the terminal port. An outer surface of the cover is provided with a locking member slidably attached to the outer surface of the cover. The locking member includes a protrusion portion that changes a protrusion amount in an interlocking manner with a slide operation on the outer surface of the cover.

5 Claims, 5 Drawing Sheets

(52) U.S. Cl.
CPC ......... *H05K 5/0226* (2013.01); *H05K 5/0239* (2013.01); *H05K 5/0247* (2013.01)

(56) References Cited

U.S. PATENT DOCUMENTS

| | | | | |
|---|---|---|---|---|
| 8,199,464 | B2* | 6/2012 | Zuo | H01R 13/447 |
| | | | | 200/302.1 |
| 9,084,352 | B2* | 7/2015 | Shinmura | H04M 1/18 |
| 9,326,403 | B2* | 4/2016 | Xie | H05K 5/0239 |
| 9,405,321 | B2* | 8/2016 | Iwamoto | G06F 1/1633 |
| 9,603,272 | B2* | 3/2017 | Yamaguchi | H05K 5/0239 |
| 2008/0291641 | A1* | 11/2008 | Sheng | G06F 1/1658 |
| | | | | 361/726 |
| 2011/0211300 | A1 | 9/2011 | Mori et al. | |
| 2013/0244737 | A1* | 9/2013 | Tanaka | H01R 13/5213 |
| | | | | 455/575.1 |

FOREIGN PATENT DOCUMENTS

| | | |
|---|---|---|
| JP | 2011-181255 | 9/2011 |
| JP | 2012-49885 | 3/2012 |

OTHER PUBLICATIONS

International Search Report dated Dec. 9, 2014 in corresponding International Application No. PCT/JP2014/004236.

* cited by examiner

ELECTRONIC DEVICE

CROSS-REFERENCE TO RELATED APPLICATIONS

This is a continuation application of International Application No. PCT/JP2014/004236, with an international filing date of Aug. 19, 2014, which claims priority of Japanese Patent Application No. JP2013-267790 filed on Dec. 25, 2013, the content of which is incorporated herein by reference.

BACKGROUND OF THE INVENTION

1. Technical Field

The technical field relates to an electronic device, and in particular, an electronic device in which a terminal port is provided in a side surface portion of a housing.

2. Description of Related Art

As is well known, in electronic devices such as personal computers and information terminal equipment, in particular, in portable electronic devices such as so-called tablet-type or note-type personal computers and tablet-type mobile information terminals, a terminal port having a connection terminal for connection to external associated equipment and a power source is generally provided on a side surface of a housing.

Such a terminal port is normally surfaced as a recess on the side surface of the housing, which is opened to the outside, and the connection terminal is disposed at the back wall of the recess. Then, a cover that closes the terminal port during non-use of the connection terminal is provided. Conventionally, the cover is configured to rotate about a hinge portion located near an opening edge portion of the terminal port, and the terminal port is opened and closed according to the rotational operation (Refer to JP 2011-181255 A).

According to an invention described in JP 2011-181255 A, a locking member is attached to the outer surface of the cover, the locking member is slidable on an outer surface of the cover and includes a protrusion portion that changes a protrusion amount in an interlocking manner with its slide operation on the outer surface of the cover. On the other hand, a site of an inner circumferential wall of the recess, in such a state that the cover blocks the recess, is provided with a lock hole that stores the protrusion portion protruded by a predetermined amount. Then, in such a state that the cover blocks the recess, the locking member is slid to cause the protrusion portion to be stored in the lock hole, and therefore, the cover is locked at a blocked position. Therefore, it is possible to reliably maintain the blocked state.

In the case that the cover is provided with a sealing mechanism that seals the recess of the terminal port, as in the invention described in JP 2011-181255 A, it can be considered that an elastic, for example, flat sealing member is disposed at the back wall of the recess so as to surround the connection terminal, and the cover is closed to apply a pressing force from the flat inner surface of the cover to the sealing member, and therefore, it is possible to achieve a sealing force.

On the other hand, it can be considered that, depending on the shape and size of the recess, an elastic ring-shaped sealing member is mounted on the outer circumference portion of the cover, and in such a state that the cover blocks the recess of the terminal port, the ring-shaped sealing member contacts the inner circumferential wall of the recess to seal the recess inside.

However, in the case of using such ring-shaped sealing member, generally, when the cover is closed to cause the ring-shaped sealing member to contact the inner circumferential wall of the recess, the operation of the sealing member interferes with the lock hole. In general, the opening edge portion of the lock hole is configured to become relatively sharp, and it can be considered that damage to the sealing member occurs when the operation of the sealing member interferes with the lock hole.

In addition, as described above, when the cover can rotate above the hinge portion located near the opening edge portion of the recess of the terminal port, depending on the size and structure of the terminal port, the cover, and the hinge portion, when the cover is operated so as to be closed and opened, a handling of the cover becomes constrained, and it is difficult to do the operation. In particular, to make the terminal port and the cover more compact, the problem of operability of the cover becomes more prominent.

SUMMARY

Thus, by one non-limiting and exemplary embodiment, it is possible to prevent the ring-shaped sealing member attached to the outer circumference of the cover to seal the terminal port on the side surface of the housing from interfering with the lock hole on the inner circumferential wall of the recess of the terminal port. In addition, by one non-limiting and exemplary embodiment, it is possible to improve operability in opening and closing the cover without increasing the size of the terminal port and the cover.

Accordingly, an electronic device in the present disclosure includes: a) a housing having an outer surface, the outer surface including opposed upper and lower surface portions and a side surface portion that couples peripheries of the upper and lower surface portions; b) a recess disposed in the side surface of the housing, the recess being opened to an outside of the housing, c) a connection terminal disposed on a back wall of the recess, and d) a cover that openably covers the recess, wherein e) an outer circumferential part of the cover is provided with a sealing member that contacts an inner circumferential wall of the recess in such a state that the cover blocks the recess to seal inside of the recess, f) an outer surface of the cover is provided with a locking member slidably attached to the outer surface of the cover, g) the locking member includes a protrusion portion that changes a protrusion amount in an interlocking manner with a slide operation on the outer surface of the cover, h) a site corresponding to the protrusion portion of the inner circumferential wall, in such a state that the cover blocks the recess, is provided with a lock hole that stores the protrusion portion protruded by a predetermined amount, and i) in the inner circumferential wall of the recess provided with the lock hole, a part provided with the lock hole and its predetermined surrounding region are lowered and formed with respect to a surface of the inner circumferential wall by a predetermined amount.

According to the electronic device of the present disclosure, in the inner circumferential wall of the recess provided with the lock hole, a part provided with the lock hole and its predetermined surrounding region are lowered and formed with respect to a surface of the inner circumferential wall by a predetermined amount. Thus, when the cover is closed to cause the ring-shaped sealing member to contact the inner circumferential wall of the recess, the sealing member can be reliably prevented from interfering with the lock hole to effectively prevent damage to the sealing member.

Additional benefits and advantages of the disclosed embodiments will be apparent from the specification and Figures. The benefits and/or advantages may be individually provided by the various embodiments and features of the specification and drawings, and need not all be provided in order to obtain one or more of the same.

DETAILED DESCRIPTION

The electronic device of the present disclosure can take following modes with the above-mentioned basic configuration. That is, the cover may be rotatably supported via a hinge portion on an outer edge portion of a slide support portion so as to be slidable inward and outward along either the upper surface portion or the lower surface portion of the housing. In such a state that the cover is closed, the slide support portion is in an initial position where the slide support portion is slid inward, and when the cover is opened, the slide support portion may be slid outward so that the hinge portion is located further outward than the opening edge portion of the recess.

According to this configuration, in such a state that the cover is closed, the slide support portion is in an initial position where the slide support portion is slid inward. When the cover is opened, the slide support portion is slid outward, and the hinge portion is located in a position further outward than the opening edge portion of the recess. Therefore, it is possible to improve operability in opening and closing the cover without increasing the size of the terminal port and the cover.

Embodiment

An embodiment will be described below in detail with reference to the drawings. However, a description more detailed than required may be omitted. For example, detailed description of well-known matters and overlapping description of substantially the same configuration may be omitted. This eliminates unnecessary redundant description and facilitates understanding of those skilled in the art.

It is noted that the appended drawings and following description are not intended to limit the scope of the invention.

In addition, in the following description, terms indicating a certain direction (for example, upper, lower, left, right, and other terms including them, clockwise, counterclockwise, etc.) may be used, and use of the terms serves to facilitate understanding of the disclosure referring to the drawings, and the present disclosure should not be limited based on the meaning of the terms.

The embodiment of the present disclosure described below is a so-called tablet-type personal digital assistant (hereinafter referred to as "tablet terminal device" or only "device").

Figure 1:
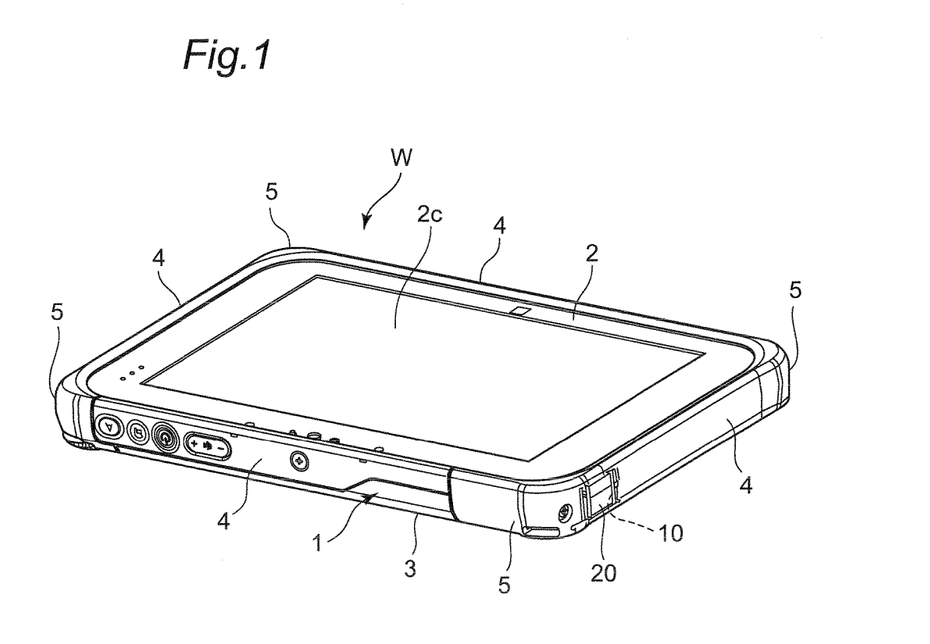
FIG. 1 is a perspective view showing a display surface side of a tablet terminal device as an electronic device according to an embodiment of the present disclosure.
Figure 2:
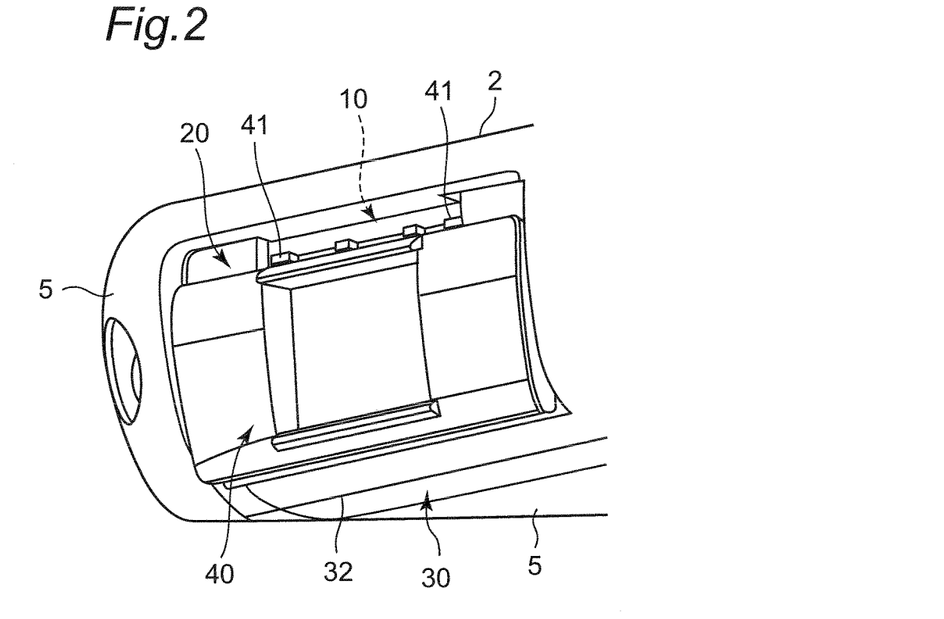
FIG. 2 is a perspective view showing the state where a terminal port of the tablet terminal device is closed with a cover.
Figure 3:
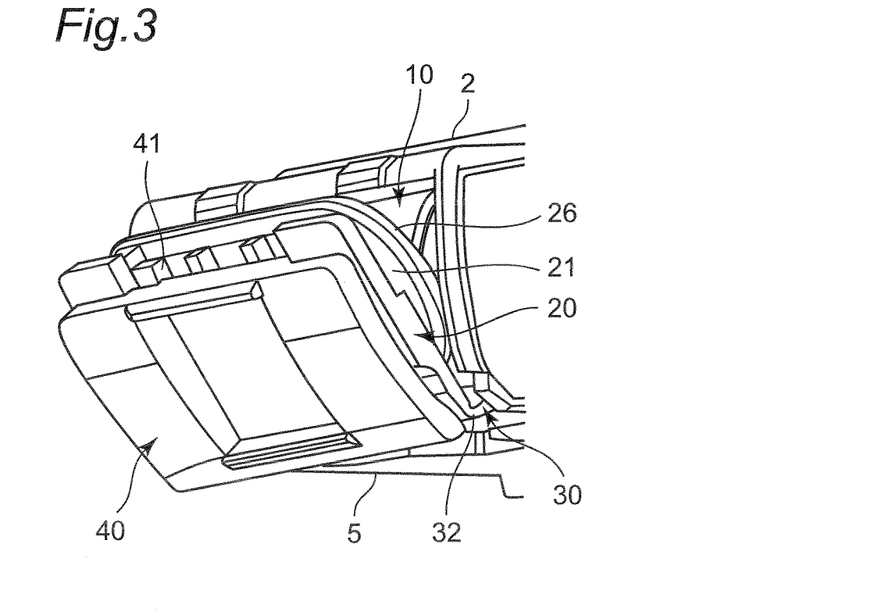
FIG. 3 is a perspective view showing the state where the cover is rotated to open.

FIG. 1 is a perspective view showing a display surface side of a tablet terminal device as an electronic device according to the present embodiment. As illustrated in this figure, a tablet terminal device W according to this embodiment includes a housing 1, which is substantially rectangular in a plan view, and has a predetermined thickness (height). This housing 1 has an outer surface consisting of an upper surface portion 2 and a lower surface portion 3, which are vertically opposed to each other, and a side surface portion 4 that connects peripheries of the upper surface portion 2 and the lower surface portion 3 to each other. The side surface portion 4 is configured of two pairs of opposed substantially flat surfaces as a main portion.

To ensure mechanical stiffness, the main portion of the housing 1 is made of metal material such as magnesium (Mg). Certain peripheral rectangular portions including each corner are covered with a cover 5 made of a material such as an elastomer, which has a higher elasticity than the material of the housing 1. For example, this cover 5 is secured to the Mg housing 1 using, for example, a screw member.

A display screen 2c using, for example, liquid crystal, is disposed on the upper surface portion 2 of the housing 1. For example, this display screen 2c is used as a touch-panel input screen. On the other hand, although not specifically illustrated, a battery pack as a portable power supply is attached to the lower surface portion 3 (back surface side) of the housing 1. The battery pack has a predetermined thickness, and is substantially rectangular in a plan view.

In the present embodiment, a terminal port 10 having a connection terminal for connection to external associated equipment (not shown) is provided at a predetermined position of the side surface portion 4 of the housing 1 of the tablet terminal device W. The terminal port 10 is provided with a cover 20 that openably covers the opening of the terminal port 10. The configuration and the like of the terminal port 10 and the cover 20 will be described as below.

As is apparent from FIGS. 4 to 7, the terminal port 10 disposed at the predetermined position of the side surface portion 4 of the housing 1 is formed as a recess opened to the outside of the housing 1, and is provided with the cover 20 that openably covers the opening of the terminal port 10. The terminal port 10 includes a back wall 11 on which, for example, a plurality of (two in the present embodiment) connection terminals Cn is disposed, a bottom wall 12 that extends from the bottom edge portion of the back wall 11 to the outside of the housing 1, a ceiling wall 14 that is opposed to the bottom wall 12 and extends from the upper edge portion of the back wall 11 to the outside of the housing 1, and a pair of curved side walls 13 that couples the ceiling wall 14 to the bottom wall 12. The ceiling wall 14, the bottom wall 12, and the pair of side walls 13 are smoothly coupled to one another to form, for example, a substantially oblong inner circumferential wall in a front view.

In addition, the cover 20 is rotatably supported on the outer edge portion of a slide support portion 30 having an L-like cross section via a hinge portion 32, and the slide support portion is supported to be slidable inward and outward along either the upper surface portion 2 or the lower surface portion 3 of the housing 1 (the lower surface portion 3 in the present embodiment). According to the present embodiment, the cover 20 and the slide support portion 30 are integrally formed using a synthetic resin material. The hinge portion 32 is a so-called PP hinge using elasticity of a resin material.

The slide support portion 30 includes a flat body portion 31 having an elongate slot 31g of predetermined width and length, and the slot 31g slidably engages with a guide pin 3p protruding downward from the lower surface portion 3 of the housing 1. The slot 31g slides inward and outward along the lower surface portion 3 of the housing 1 while being guided by the guide pin 3p, causing the cover 20 to slide in the same direction. It is noted that the body portion 31 of the slide support portion 30 and a lower portion of the guide pin 3p are covered with the cover 5.

Figure 4:
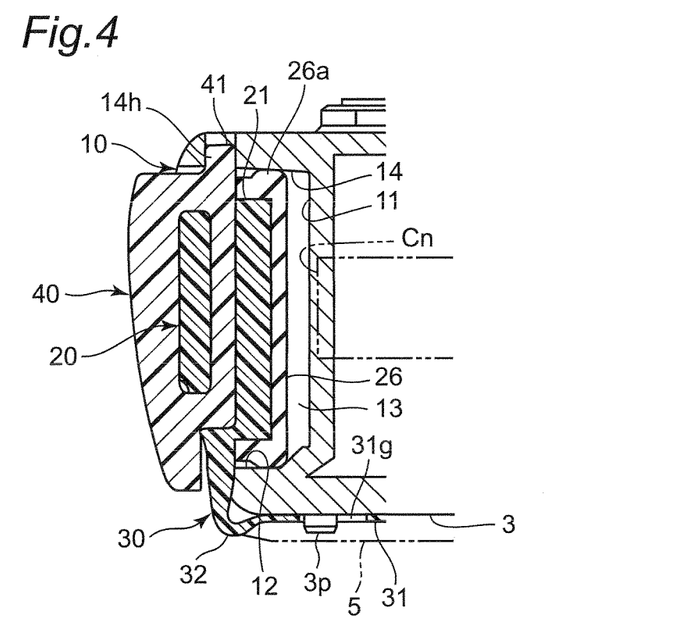
FIG. 4 is a longitudinal-sectional view showing the state where the cover is closed and locked.
Figure 5:
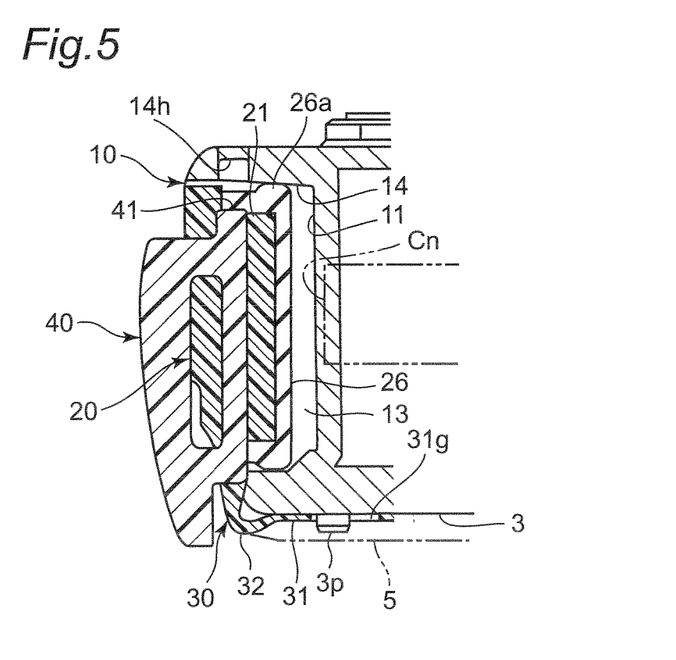
FIG. 5 is a longitudinal-sectional view showing the state where locking of the cover is released.
Figure 6:
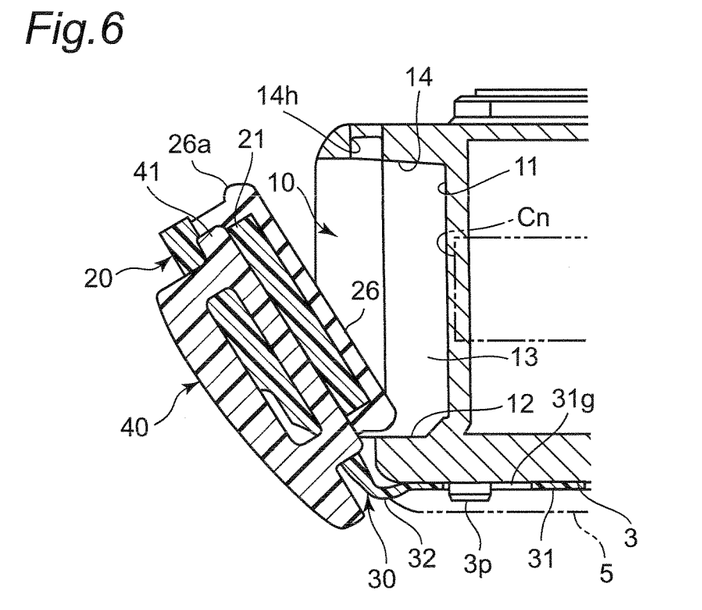
FIG. 6 is a longitudinal-sectional view showing the state where the cover is rotated to open.
Figure 7:
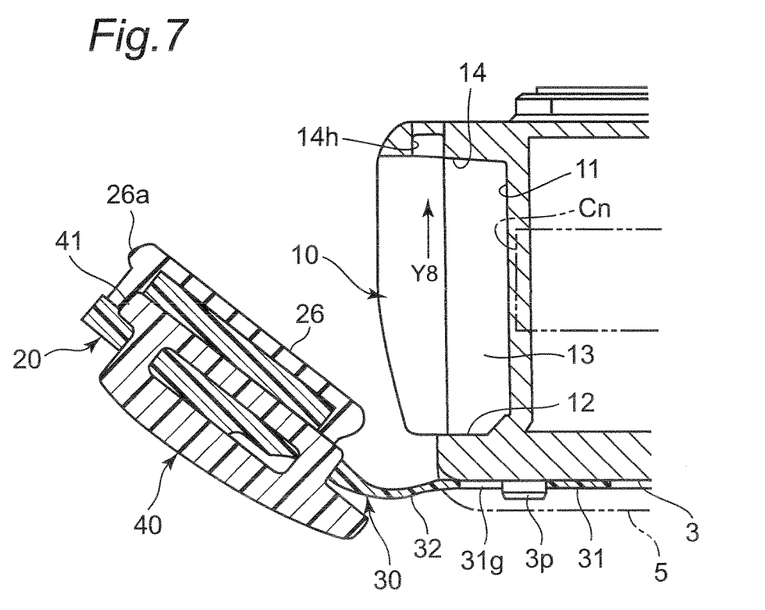
FIG. 7 is a longitudinal-sectional view showing the state where a slide support portion that supports the cover slides outward.

In such a state that the cover 20 is closed, the slide support portion 30 is in an initial position where the slide support portion 30 is slid inward (See FIG. 4 and FIG. 5). When the cover 20 is opened, the slide support portion 30 is slid outward, and the hinge portion 32 can be located in a position further outward than the opening edge portion of the recess of the terminal port 10 (See FIG. 7).

Therefore, it is possible to improve operability in opening and closing the cover 20 without increasing the size of the terminal port 10 and the cover 20.

In addition, a locking member 40 slidably attached to the outer surface of the cover 20 is disposed on the outer surface of the cover 20, and the locking member 40 include a protrusion portion 41 that changes a protrusion amount in an interlocking manner with a slide operation on the outer face of the cover 20. The locking member 40 can vertically slide along the outer surface of the cover 20 between a protrusion position where the protrusion 41 protrudes upward from the cover 20 (See FIG. 4) and a retraction position where the protrusion 41 retracts downward (See FIGS. 5 to 7).

Although not specifically illustrated, to position the locking member 40 at the protrusion position and the retraction position, a pair of upper and lower positioning dents is formed in the outer surface of the cover 20 (the surface opposed to the locking member 40). On the other hand, a projection fitted into one of the positioning d e n t s according to the sliding position of the locking member 40 is provided on the inner surface (the surface opposed to the cover 20) of the locking member 40. Due to interaction of the positioning dent and the projection, the locking member 40 is stably held on the outer surface of the cover 20 at either the protrusion position or the retraction position. It is noted that positioning of the locking member 40 using a combination of the cover 20 and the locking member 40, and a combination of the positioning dent and the projection is similar to existing positioning techniques, and for example, the configuration disclosed in JP 2011-181255 A may be applied.

On the inner circumferential wall of the terminal port 10, at a site corresponding to the protrusion 41 (that is, a certain site of the ceiling wall 14 of the inner circumferential wall) in the state where the cover 20 blocks the terminal port 10, is provided a pair of lock holes 14h that receives a pair of respective protrusions 41, which protrudes by a predetermined amount at the protrusion position of the locking member 40 (See FIG. 4).

In addition, an extension portion 21 that extends inward by a predetermined amount is formed integrally with the inner surface of the cover 20. The outer shape of the extension portion 21 is an ellipse corresponding to the shape of the inner circumferential walls 12, 13, and 14 of the terminal port 10. The extension portion 21 is equipped with a sealing member 26 that contacts the substantially elliptic inner circumferential wall of the terminal port 10 in the state where the cover 20 blocks the terminal port 10 to seal the inside of the terminal port 10. The sealing member 26 is made of a relatively elastic sealing material such as rubber and soft resin so as to hang over the front surface and the outer periphery of the extension portion 21.

A substantially elliptic ring-shaped portion 26a attached to the outer periphery of the extension portion 21 abuts the inner circumferential wall to seal the inside of the terminal port 10.

A sealing position of the sealing member 26, in such a state that the cover 20 blocks the terminal port 10, is closer to the back wall 11 than the lock hole 14h provided in the ceiling wall 14 of the inner circumferential wall of the terminal port 10. Accordingly, when the cover 20 is closed to block the terminal port 10, sliding of the ring-shaped portion 26a of the sealing member 26 may interfere with the lock hole 14h. The opening edge portion of the lock hole 14h is relatively sharp and therefore, if the ring-shaped portion 26a of the sealing member 26 interferes with the lock hole 14h, the ring-shaped portion 26a of the sealing member 26 may be damaged.

Figure 8:
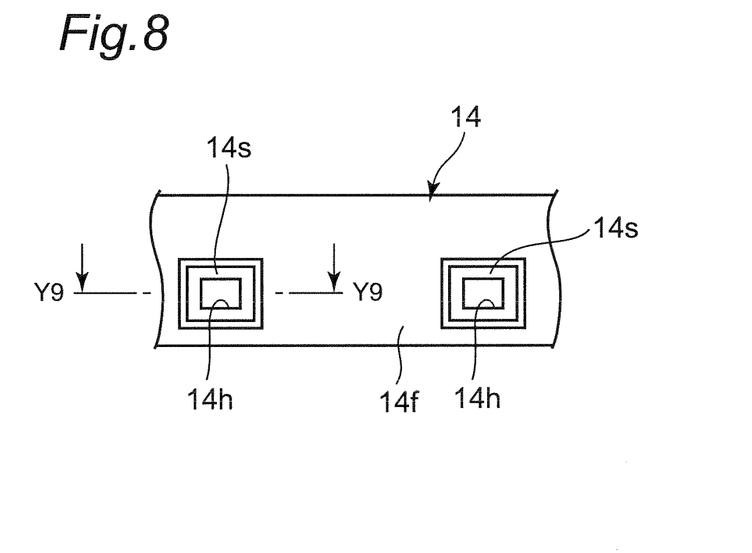
FIG. 8 is a view of a lock hole of the terminal port when viewed in a direction of an arrow Y8 in FIG. 7.
Figure 9:
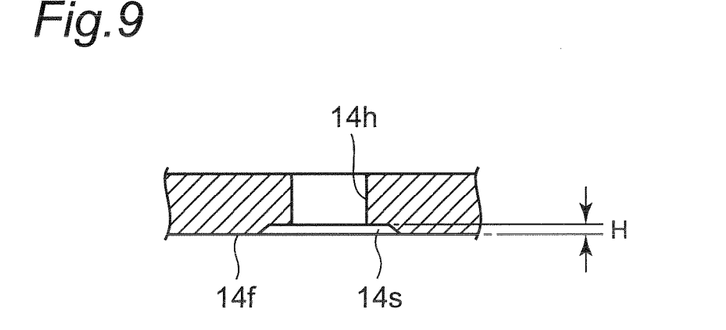
FIG. 9 is a longitudinal-sectional view of the lock hole taken along a line Y9-Y9 in FIG. 8.

Thus, in the present embodiment, as illustrated in FIG. 8 and FIG. 9, in the inner circumferential wall (that is, the ceiling wall 14) of the terminal port 10 having the lock hole 14h, the lock hole 14h and a predetermined surrounding region 14s are lowered from a surface 14f of the ceiling wall 14 by a predetermined amount H mm. In the present embodiment, the lowering amount H is set to, for example, about 0.3 mm.

As described above, in the ceiling wall 14 of the terminal port 10 having the lock hole 14h, the lock hole 14h and the predetermined surrounding region 14s are lowered from the surface 14f of the ceiling wall 14 by the predetermined amount H. Thus, when the cover 20 is closed to cause the ring-shaped portion 26a of the sealing member 26 to slide onto the ceiling wall 14, sliding of the ring-shaped portion 26a of the sealing member 26 can be reliably prevented from interfering with the lock hole 14h to effectively prevent damage to the ring-shaped portion 26a of the sealing member 26.

As described above, the embodiments are described as examples of the technique according to the present disclosure. To this end, the detailed description and accompanying drawings are provided.

Therefore, the components described in the detailed description and accompanying drawings may include not only those components necessary to solve the problems, but also those components to exemplify the technique and not necessary to solve the problems. Hence, the unnecessary components should not be judged to be necessary just because the unnecessary components are described in the detailed description and accompanying drawings.

The embodiment as described above is applied to a so-called tablet terminal apparatus as an example. However, the embodiment of the present disclosure is not limited thereto. For example, the embodiment of the present disclosure can be applied to various electronic devices.

The above-described embodiments are examples of the technique according to the present disclosure, and therefore, it is possible to make various changes, substitutions, additions, omissions, etc., within the scope of the claims or their equivalency.

INDUSTRIAL APPLICABILITY

The present disclosure can be effectively applied to any electronic device in which a terminal port is provided on a side surface of a housing.

What is claimed is:

1. An electronic device comprising:
   a housing having opposed upper and lower surface portions and a side surface portion that couples peripheries of the upper and lower surface portions;
   a recess in the side surface portion of the housing, the recess being opened to an outside of the housing;
   a connection terminal on a back wall of the recess; and
   a cover configured to openably cover the recess,
   wherein:
   an outer circumferential part of the cover is provided with a sealing member that contacts an inner circumferential wall of the recess in such a state that the cover blocks the recess to seal an inside of the recess,
   an outer surface of the cover is provided with a locking member slidably attached to the outer surface of the cover,
   the locking member includes a protrusion portion configured to change a protrusion amount in an interlocking manner with a slide operation on the outer surface of the cover,
   a site of the inner circumferential wall of the recess corresponding to the protrusion portion is provided with a lock hole that, in the state that the cover blocks the recess, stores the protrusion portion which is protruded,
   in the inner circumferential wall of the recess provided with the lock hole, a part provided with the lock hole and a predetermined surrounding region of the part provided with the lock hole are formed so as to be lowered with respect to a surface of the inner circumferential wall of the recess,
   the inner circumferential wall of the recess provided with the lock hole extends from the back wall of the recess to the outside of the housing, and
   a transitional portion which connects the surface of the inner circumferential wall of the recess with a surface of a lowered portion which is formed so as to be lowered with respect to the surface of the inner circumferential wall of the recess, is formed so as to have an obtuse angle or a curved surface.

2. The electronic device according to claim 1, wherein:
   the cover is rotatably supported via a hinge portion on an outer edge portion of a slide support portion, the slide support portion being slidably supported inward and outward along the upper surface portion of the housing or the lower surface portion of the housing, and
   in such a state that the cover is closed, the slide support portion is in an initial position where the slide support portion is slid inward, and when the cover is opened, the slide support portion is slid outward so that the hinge portion is located further outward from the back wall of the recess than an opening edge portion of the recess.

3. The electronic device according to claim 2, wherein the slide support portion includes a flat body portion having an elongate slot, and the elongate slot slidably engages with a guide pin.

4. The electronic device according to claim 1, wherein the hinge portion is an elastic hinge portion.

5. The electronic device according to claim 1, wherein the sealing member has a ring-shaped portion configured to slide onto the inner circumferential wall of the recess.

* * * * *